(12) United States Patent
Corr

(10) Patent No.: US 6,807,502 B2
(45) Date of Patent: Oct. 19, 2004

(54) APPARATUS AND METHOD FOR DETERMINING EFFECT OF ON-CHIP NOISE ON SIGNAL PROPAGATION

(75) Inventor: William E. Corr, Twickenham (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/443,389

(22) Filed: May 22, 2003

(65) Prior Publication Data

US 2003/0204351 A1 Oct. 30, 2003

Related U.S. Application Data

(62) Division of application No. 10/016,183, filed on Oct. 30, 2001.

(51) Int. Cl.$^7$ ........................................... G01R 31/3187
(52) U.S. Cl. ........................ 702/117; 702/75; 702/191; 324/765
(58) Field of Search .......................... 702/117, 57–59, 702/65, 89, 75, 118, 79, 107, 108, 120, 121, 124, 126, 166, 185, 189, 191, 195, FOR 103–FOR 105, FOR 134, FOR 135, FOR 170, FOR 171; 714/724, 726, 733, 734, 745, 817, 731; 324/763, 765, 686, 73.1, 181, 113, 681, 613; 368/118, 120; 716/4–6; 327/46; 331/57

(56) References Cited

U.S. PATENT DOCUMENTS

| | | | |
|---|---|---|---|
| 4,481,628 A | 11/1984 | Pasquinelli | 714/745 |
| 4,587,480 A | 5/1986 | Zasio | 324/310 |
| 5,668,507 A | 9/1997 | Boerstler et al. | 331/78 |
| 5,737,342 A | 4/1998 | Ziperovich | 714/736 |
| 5,790,479 A | 8/1998 | Conn | 368/118 |
| 5,890,100 A | 3/1999 | Crayford | 702/130 |
| 5,900,753 A * | 5/1999 | Cote et al. | 327/145 |
| 5,923,676 A | 7/1999 | Sunter et al. | 714/733 |
| 5,963,043 A | 10/1999 | Nassif | 324/681 |
| 6,005,829 A | 12/1999 | Conn | 368/113 |
| 6,185,706 B1 | 2/2001 | Sugasawara | 714/724 |
| 6,219,305 B1 | 4/2001 | Patrie et al. | 368/113 |
| 6,223,314 B1 | 4/2001 | Arabi et al. | 714/726 |
| 6,239,603 B1 | 5/2001 | Ukei et al. | 324/763 |
| 6,286,117 B1 | 9/2001 | Yun et al. | 714/724 |
| 6,304,097 B1 | 10/2001 | Chen | 324/765 |
| 6,556,938 B1 * | 4/2003 | Rohrbaugh et al. | 702/117 |
| 2002/0007253 A1 * | 1/2002 | Yamashita et al. | 702/111 |

\* cited by examiner

*Primary Examiner*—Hal D. Wachsman
(74) *Attorney, Agent, or Firm*—Thorp Reed & Armstrong, LLP

(57) ABSTRACT

The invention relates to a method for measuring the effects of on-chin noise on signal propagation comprising measuring an inactive operating frequency of a first test circuit having a first plurality of elements connected by a first plurality of traces, measuring an inactive operating frequency of a second test circuit having a second plurality of elements connected by a second plurality of traces, measuring an inactive operating frequency of a third test circuit having a third plurality of elements connected by a third plurality of traces, and measuring an inactive operating frequency of a fourth test circuit having a fourth plurality of elements connected by a fourth plurality of traces, wherein the inactive operating frequencies of the first second, third, and fourth test circuits represent one or more effects of on-chin noise on signal propagation.

16 Claims, 10 Drawing Sheets

APPARATUS AND METHOD FOR DETERMINING EFFECT OF ON-CHIP NOISE ON SIGNAL PROPAGATION

CROSS-REFERENCE TO RELATED APPLICATIONS

The present invention is a divisional of pending U.S. application Ser. No. 10/016,183 entitled "Apparatus and Method for Determining Effect of On-Chip Noise on Signal Propagation" filed Oct. 30, 2001 and assigned to the same assignee as the present invention.

FIELD OF THE INVENTION

The present invention relates generally to testing integrated circuits and more particularly to testing the on-chip effects of noise and cross-talk on signal propagation.

BACKGROUND

Most integrated circuit (hereafter also referred to as IC devices, IC chips, or IC boards) contain a multitude of components, such as transistors, capacitors, resistors, processors, logic gates (for example AND, OR, NAND, and NOR, etc.), and memory caches, among others. These components are placed on a substrate material and connected by a series of electrical traces (i.e., conductors). Most components receive power via a power distribution bus which is connected to one or more power supplies.

Data signals are passed between components via the traces. The route used to pass a data signal between components is referred to as a data path, or logic path. The coupling of a data signal from one trace (usually called the aggressor) and another trace (usually called the victim) is referred to as cross-talk, whereas the effect of power supplies and power buses on a data signal is referred to as noise.

Today's integrated circuits benefit from two major improvements over integrated circuits constructed a few years ago. The first improvement encompasses the integrated circuit's operating voltage. Current integrated circuits operate at lower voltages than their predecessors. Thus, systems employing today's integrated circuits consume less power than systems employing older integrated circuits, and as such are extremely beneficial for portable devices manufactures, for example. The second improvement encompasses component density. Current integrated circuits have higher component densities than their predecessors. In other words, current integrated circuits have more components packed within a given area than older integrated circuits. Higher density integrated circuits allow manufacturers either to offer smaller devices which perform the same functions as older devices, or to offer similar sized devices with additional functions.

Undesirable effects, however, have accompanied the shift to higher density, lower voltage integrated circuits. For example, noise and cross-talk have an increased effect on internal circuit path delays. Noise and cross-talk that would have barely been noticeable within older integrated circuits may render current integrated circuits inoperable.

Compounding the problems caused by noise and cross-talk is the lack of adequate testing methods to measure their effects on signal delays (among others) within the integrated circuit. For example, noise and cross-talk effects are usually frequency dependent. Thus, during manufacture, a chip may pass a low frequency functional test, but fail to properly function when placed and operated within a system at normal operating frequency.

Current testing methods can be grouped into two categories, simulation analysis methods and laboratory analysis methods. Both categories have limitations which impact their ability to detect conditions that may lead to integrated circuit failures.

Simulation analysis methods are said to be static-based, meaning that the amount of noise is calculated from an assumption of what is actually happening within the integrated circuit. The assumptions are based on the logic topology of the integrated circuit being tested, and are not, an actual measurement of the amount of noise found on the integrated circuit. Because assumptions must be made, simulation analysis methods are inaccurate.

Some simulation analysis methods attempt to overcome this inherent inaccuracy by employing simulation vectors to determine the effects of noise and cross-talk. However, the use of simulation vectors to accurately model a device working in a system environment consumes a great amount of time. The more complex the integrated circuit, the greater the time required for testing. Simulation analysis methods, therefore, are unlikely to be used to test today's high density integrated circuits. Thus, the operating conditions which lead to circuit failures on today's integrated circuits are not discovered.

Laboratory analysis methods, the second testing category, are said to be dynamic because the chip is tested as close to its normal operating frequency as possible. Laboratory analysis methods are preferable to simulation analysis methods because the "real life" integrated circuit characteristics are more accurately modeled.

A laboratory testing method usually entails using high speed test equipment to supply vectors to the integrated circuit. Logic testers are then used to determine the effects of the vectors on the integrated circuit. Unfortunately, high speed test equipment is usually not capable of driving large numbers of vectors into the many signal pins present on the integrated circuit. Furthermore, the logic testers tend to operate at frequencies that are much lower than the operating frequency of the integrated circuit. Thus, even though preferable, laboratory analysis methods are usually avoided because it is difficult to drive a large integrated circuit at its system operating frequency while simultaneously gathering in-circuit measurements.

A need exists, therefore, for an apparatus and method for dynamically determining the effects of signal noise and cross-talk on on-chip signal propagation while the integrated circuit is operating in its normal mode. Furthermore, a need exists for an apparatus and method that allows the determination to be made quickly and using standard laboratory test equipment.

SUMMARY

A method and apparatus is disclosed for dynamically testing an integrated circuit in its normal operating mode. The method and apparatus can be used to determine the effects of signal noise and cross-talk have on on-chip signal propagation. The method and apparatus allow the determination to be made quickly, using standard laboratory test equipment.

An apparatus for testing an integrated circuit is disclosed comprised of a plurality of test circuits. A first test circuit is operable to produce a signal used to determine at least one of an operating reference signal and the substrate coupling effect on components within the integrated circuit. The first test circuit has elements connected by traces and is routed to mimic a data path within the integrated circuit. A second test circuit is operable to produce a signal used to determine at least one of a cross-talk effect on the components within the integrated circuit and the accuracy of an interconnect capacitance extraction value. The second test circuit has elements connected by traces which are routed within the core logic area of the integrated circuit. A third test circuit is operable to produce a signal used to determine at least one of an effect of system noise on the operational speed of the components within the integrated circuit and a maximum degradation expected for a logic path between the components. The third test circuit has elements connected by traces. The third test circuit is randomly located within the core logic area of the integrated circuit. A fourth test circuit operable to produce a signal used to determine an effect of power supply noise on a signal propagation delay within the components within the integrated circuit. The fourth test circuit has elements connected by traces and is routed to mimic a data path within the integrated circuit. The fourth test circuit shares a power supply with the components within the integrated circuit.

The present invention encompasses a testing system having a plurality of ring oscillators constructed for dynamically measuring the effects of noise and cross-talk on the memory device. The testing system also includes a signal generator able to produce at least one of a 'clr' signal and a 'run' signal, where at least one of the 'clr' and 'run' signals are applied to at least one of the plurality of ring oscillators. The testing system also includes a signal analyzer able to retrieve an output signal from at least one of the plurality of ring oscillators.

The present invention also encompasses a method for dynamically testing the effects of signal noise and cross-talk on an integrated circuit having a core logic area. The method comprises measuring an inactive operating frequency for each of a plurality of test circuits; measuring an active operating frequency for each of a plurality of test circuits; and analyzing the plurality of inactive and active operating frequencies to determine the effects of signal noise and cross-talk on the integrated circuit.

BRIEF DESCRIPTION OF THE DRAWINGS

To enable the present invention to be easily understood and readily practiced, the present invention will now be described for purposes of illustration and not limitation, in connection with the following figures, wherein.

DETAILED DESCRIPTION

The following description illustrates several embodiments which serve to explain the principles of the present invention. The embodiments are not intended to limit, in any way, the scope of the present invention and are used only as a means of enabling one skilled in the art to practice the principles set forth by the present invention.

Figure 1:
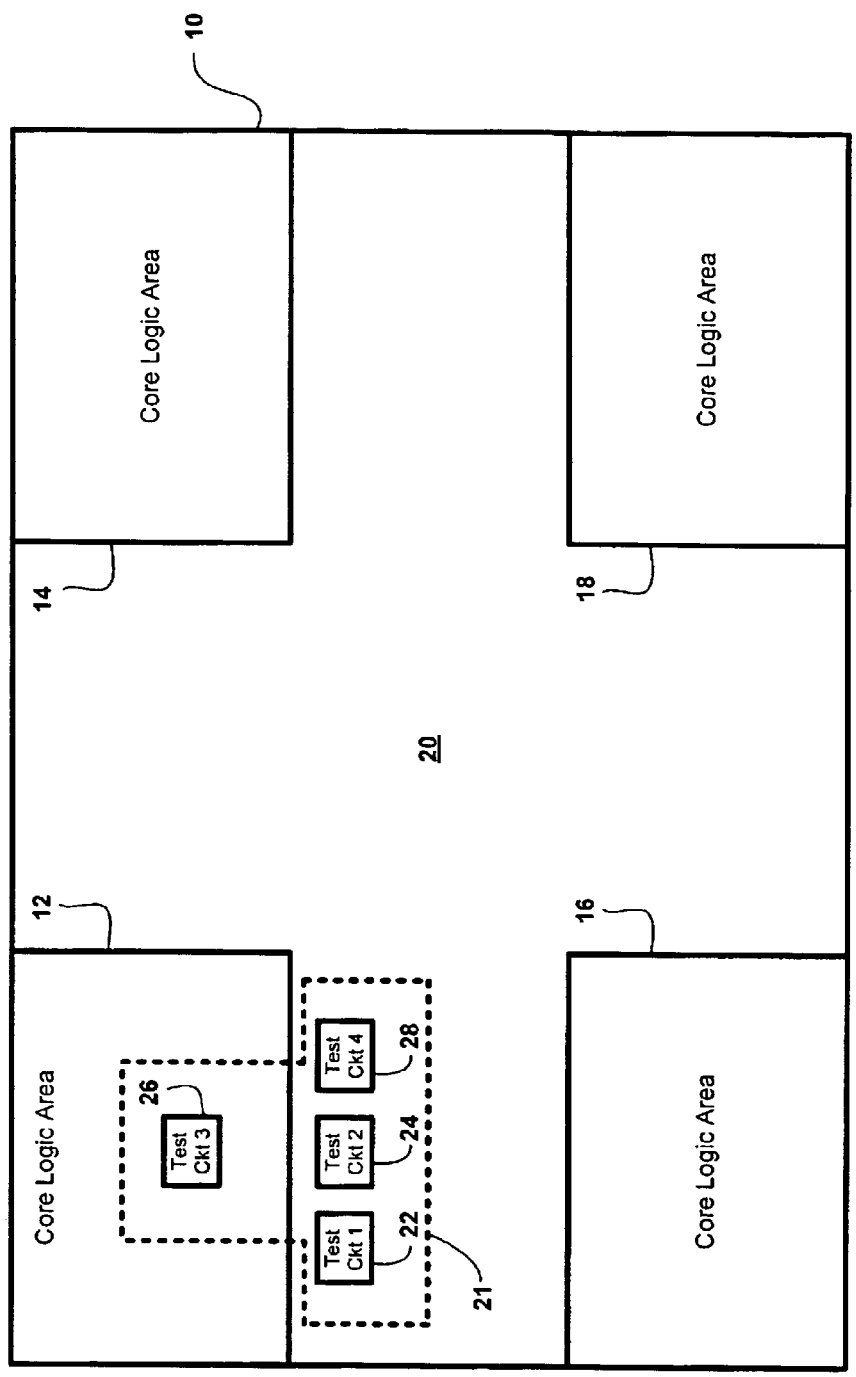
FIG. 1 is a simplified view illustrating an integrated circuit chip employing a testing apparatus in accordance with an embodiment of the present invention.

A simplified view of an integrated circuit chip ("IC chip") 10 employing a testing apparatus 21 according to an embodiment of the present invention is illustrated in FIG. 1. The IC chip 10 is divided into four core logic areas 12, 14, 16, 18. A core logic area 12, 14, 16, 18 is a portion of the IC chip 10 containing integrated circuit components such as transistors, capacitors, resistors, processors, logic gates, and memory caches, among others. The components are interconnected to form a multitude of data paths on which signals are transmitted from one component to another. A power distribution system, having a multitude of power supply buses, interlaces the core logic area and supplies the necessary power to the components.

The IC chip 10 also contains space between the core logic areas 12, 14, 16, 18. The space is hereinafter referred to as the "reserved area" 20. The reserved area 20 contains, for example, power routing, data line routing, peripheral circuits (such as amplifiers, boost, and sense circuits, among others) used by the core logic areas 12, 14, 16, 18, and contact pads which connect the IC chip 10 to external systems (such as test systems and computer systems, among others).

In FIG. 1, the testing apparatus 21 having a set of four test circuits 22, 24, 26, 28 is shown for testing IC chip 10, and more specifically for testing core logic area 12. In the current embodiment, one or more of the test circuits 22, 24, 26, 28 are located within the reserved area.

It should be noted that, for simplicity, the following discussion of the present invention has been limited to a single testing apparatus 21, a portion of which is located within core logic area 12. However, the use of multiple testing apparatus 21 for testing other portions of the IC chip 10 (e.g., the other core logic areas 14, 16, 18) is within the scope of the present invention. Furthermore, the present invention encompasses IC chips having alternative layouts and an alternative number of core logic areas. For example, an IC chip containing only one core logic area for the entire chip surface is within the scope of the present invention.

A group of test circuits (e.g., test circuits 22, 24, 26, 28) comprises a testing apparatus 21 for dynamically monitoring an integrated circuit 10. In one embodiment, the testing apparatus 21 contains four test circuits 22, 24, 26, 28 each functioning as ring oscillators. Each test circuit 22, 24, 26, 28 may contain elements, or cells, such as logic gates, inverters, and output dividers, among others. The elements are connected to one another via electrical traces. The element placement and trace routing of each of the four test circuits 22, 24, 26, 28 is selected to isolate specific test quantities (such as noise, cross-talk, etc.) within the IC chip 10. For example, test circuit 22, whose components are located in the reserved area 20 of the IC chip 10, measures a different quantity than test circuit 26, whose components are located within the core logic area 12.

The number of inverters used by each test circuit 22, 24, 26, 28 in the current embodiment is preferably restricted such that the ring oscillator loop remains inverting and the oscillation frequency remains low enough for on-chip division. Contact pads are used to connect the test circuits 22, 24, 26, 28 to external test equipment. For example, the "run", "clr" and "output" lines of the test circuits 22, 24, 26, 28 (as shown in FIGS. 2–5) each have a contact pad that is accessible by external test equipment. Each test circuit 22, 24, 26, 28 is described in more detail below. It should be noted that additional test circuits may be added to the IC chip 10 as needed. Furthermore, non-ring oscillator test circuits may be substituted to obtain similar results.

Figure 2:
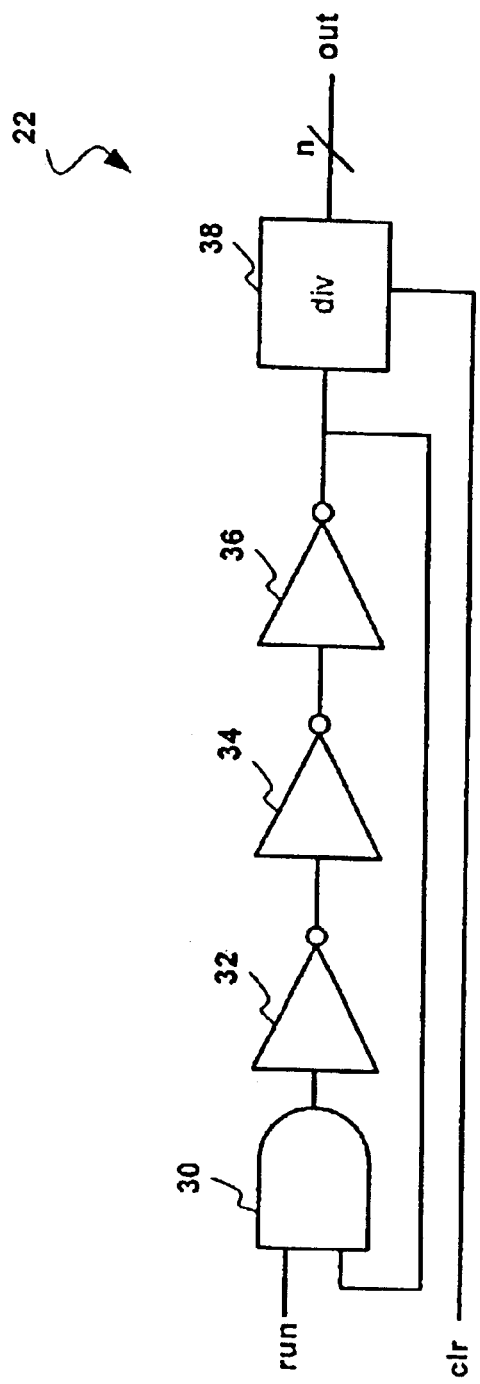
FIG. 2 illustrates a schematic drawing of a test circuit within the testing apparatus used to determine an operating reference signal for the integrated circuit as shown in FIG. 1 according to an embodiment of the present invention.

A detailed schematic drawing of test circuit 22 (TC22) is shown in FIG. 2. TC22 is comprised of a series connected AND gate 30, inverters 32, 34, 36, and a divider 38. An output of inverter 36 is fed back to AND gate 30; a 'run' signal is also fed into AND gate 30; and divider 38 is responsive to a clear signal 'clr'.

TC22 is used to determine an operating reference signal, or "golden reference", for the IC chip 10 shown in FIG. 1. Operating reference signal refers to the signal frequency against which all other frequencies are judged. In the current embodiment, TC22 is constructed such that it operates in an ideal environment with no external disrupting influences. Any deviation from the operating reference signal by the other test circuits can be assumed to be caused by the external influence (i.e., cross-talk, noise, etc.) that the specific test circuit is designed to measure.

In the current embodiment, the elements of TC22 are selected and connected to mimic a data path that is typically found within one of the core logic areas 12, 14, 16, 18 of the IC chip 10. For example, the elements of TC22 are placed and routed with a minimum amount of distance between each element. To isolate TC22 from any power supply noise effects found on the IC chip 10, TC22 is directly connected to an external power supply. An external power supply refers to a power source that does not supply power to the components within the core logic area. In the current embodiment, the external power supply is dedicated exclusively for the use of TC22, however, in alternative embodiments, the power supply can be shared with other test circuits (e.g., 24 and 28) or with peripheral circuits within the reserved area 20.

In the current embodiment, the operating frequency of TC22 is measured with all of the components within the core logic areas 12, 14, 16, 18 and within the reserved area 20 in the inactive mode. In the current embodiment, inactive mode refers to removing clock signals and power, among others, from the components. In an alternative embodiment, less than all of the components may have the power and clock signals (among others) removed when placing the IC chip 10 in the inactive mode.

By placing the IC chip 10 in the inactive mode, TC22 is not disturbed by power supply noise or cross-talk induced effects caused by other components. Thus the operating frequency of TC22, measured while the IC chip 10 is in the inactive mode, represents the operating reference frequency of the IC chip 10. The operational frequency of TC22 is then measured with the IC chip 10 in the active mode (i.e., in its normal operating mode). The active operating frequency of TC22 is used to determine the effect of substrate noise coupling on circuit delays within the core logic area by comparing it with the operating reference frequency.

Figure 3:
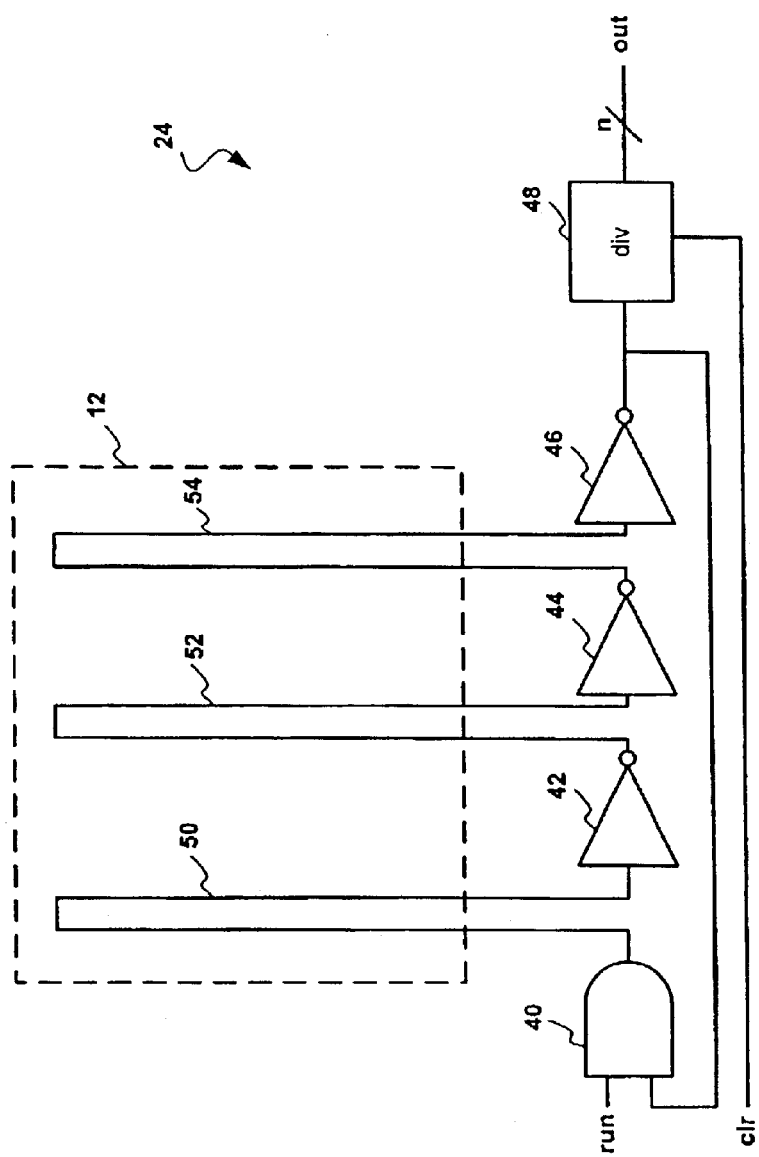
FIG. 3 illustrates a schematic drawing of a test circuit within the testing apparatus used to determine the cell delay of the integrated circuit shown in FIG. 1 caused by cross-talk according to an embodiment of the present invention.

A detailed schematic drawing of test circuit 24 (TC24) is shown in FIG. 3. In the current embodiment, TC24 is used to determine the cell delay caused by cross-talk within the IC chip 10 shown in FIG. 1. Cell delay refers to the time it takes a signal to propagate from the input to the output of a cell (i.e., element). Cross-talk refers to the coupling of a signal from one trace (usually termed the 'aggressor') to another trace ('victim'). Cell delay caused by cross talk refers to the situation where the switching of the input signal of a gate is perturbed by another signal (aggressor) signal such that the input signal's rise or fall time is increased or decreased sufficiently to change the expected propagation time through the cell. For example, a non-inverting gate may require 200 ps to switch from low to high (i.e., 200 ps rise time). If a neighboring (aggressor) signal happened to switch from high to low at the same time, the rise time of the victim gate may be decreased significantly. This would have the apparent effect of slowing down the signal propagation through the victim gate, or increasing the victim gate's cell delay.

Like TC22, an external power supply is connected to TC24 to isolate TC24 from power supply noise effects found on the IC chip 10. Also, as discussed in conjunction with TC22, the elements of TC24 are placed close together to mimic a data path within the IC chip 10. The elements (i.e., cells) comprising TC24 include series connected AND gate 40, inverter 42, inverter 44, inverter 46, and divider 48 interconnected like the elements of TC22. However, the element-to-element interconnects 50, 52, 54 (i.e., the traces) of TC24 are routed in paths extending into the core logic area 12 of the IC chip 10. For example in one embodiment, the traces are formed into long loops 50, 52, 54 which extend deep into the core logic area 12.

In the current embodiment, an inactive operating frequency and active operating frequency for TC24 is measured with all of the components within the core logic areas 12, 14, 16, 18 and within the reserved area 20 inactive and active, respectively. With the body of the IC chip 10 inactive, the accuracy of the interconnect capacitance extraction value can be determined using the difference between the inactive operating frequency of TC24 and a predicted operating frequency. The interconnect capacitance extraction value refers to the capacitance of the traces used to connect the various components of the chip together. 'Interconnect' refers to the direct impact on the switching speed of the gate outputs; 'interconnect' must be known to perform meaningful computer simulations. 'Extraction' refers to the process of determining these capacitances algorithmically or by measurement. Generally, a set of test cases are fabricated to model a portion of the chip and their capacitances measured directly. A computer model is then used to determine algorithmically the capacitances of the complete chip.

The predicted operating frequency can be found by computer simulation of the circuit. Furthermore, the active operating frequency of TC24 is used to determine the effects of cross-talk on components within the core logic area. The active operating frequency of can also be found using computer simulation, but the effects on operating frequency caused by cross-talk and noise are generally not determined at this stage as most simulators do not account for these factors. It should be noted that the cross-talk analysis can be targeted to a specific layout topology or core logic component by routing the traces 50, 52, 54 of TC24 within a specific device layer or constraining the traces of TC24 to a specific routing methodology.

Figure 4:
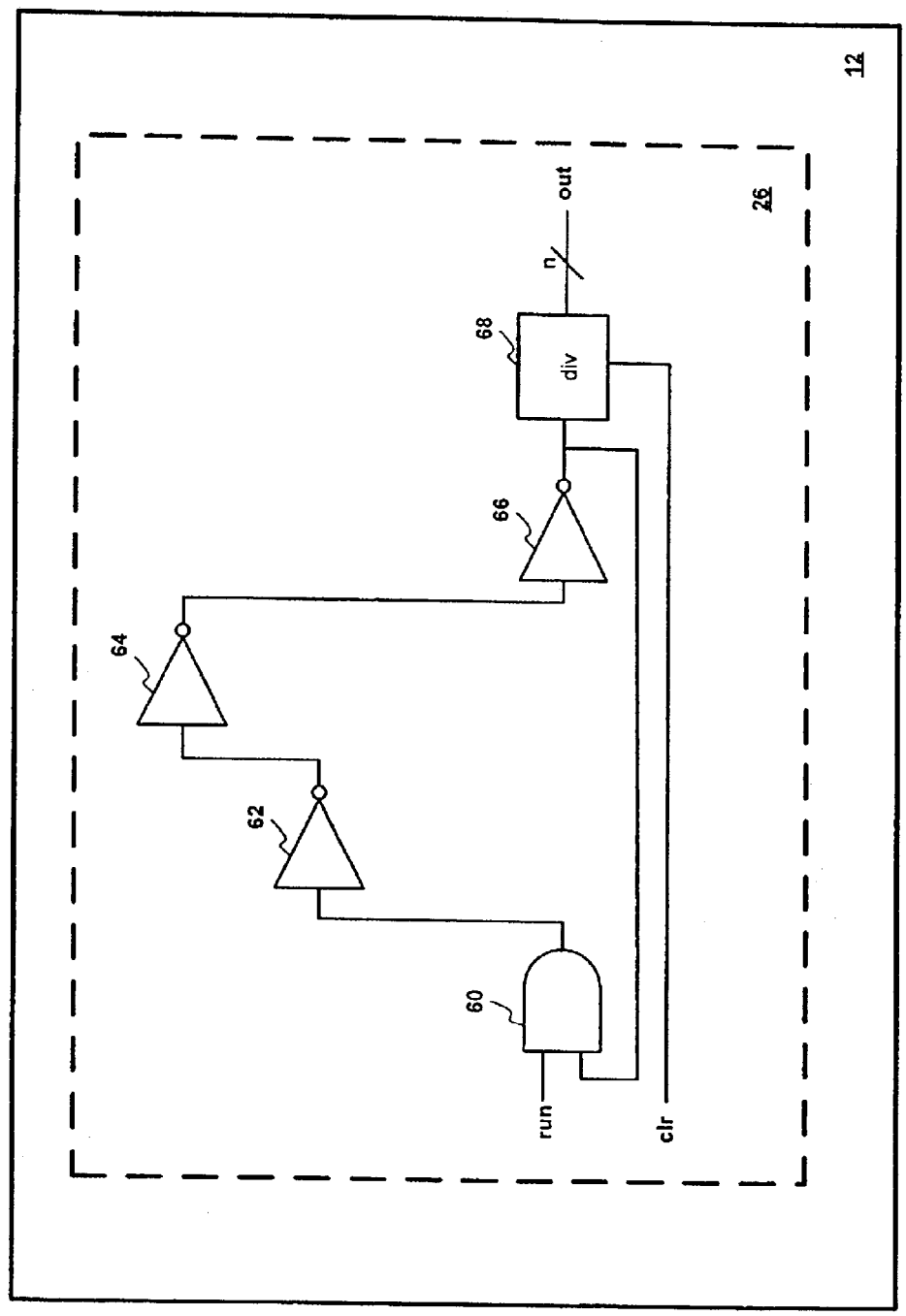
FIG. 4 illustrates a schematic drawing of a test circuit within the testing apparatus used to determine the effects of system noise on the integrated circuit shown in FIG. 1 according to an embodiment of the present invention.

A detailed schematic drawing of test circuit 26 (TC26) is shown in FIG. 4. In the current embodiment, TC26 is used to determine the effects of system noise on the operational speed of the components within a core logic area (e.g., 12, 14, 16, and 18). In the current embodiment, the elements of TC26 are randomly placed and the traces randomly routed within the core logic area 12 of the IC chip 10. The elements may include a series connected AND gate 60, inverters 62, 64, 66, and divider 68. An external power supply is connected to TC26. Thus, TC26 experiences the same power supply and cross-talk noise experienced by the IC chip's internal logic.

In the current embodiment, an inactive operating frequency and active operating frequency for TC26 is measured with all of the components in the core logic areas 12, 14, 16, 18 and within the reserved area 20 inactive and active, respectively. The difference between the inactive operating frequency and the active operating frequency of TC26 is used to determine the effects of system noise on the operational speed of the components within the core logic areas 12. The comparison of this difference to the operating reference signal determined by TC22 is used to represent the maximum degradation that can be expected for a logic path within the core logic area 12. Maximum degradation refers to largest amount of perturbation experienced by a circuit caused by external influences such as power supply noise and cross talk. Thus, the circuit's operating frequency would be expected to be furthest away (i.e., higher or lower) from the reference circuit's frequency.

Figure 5:
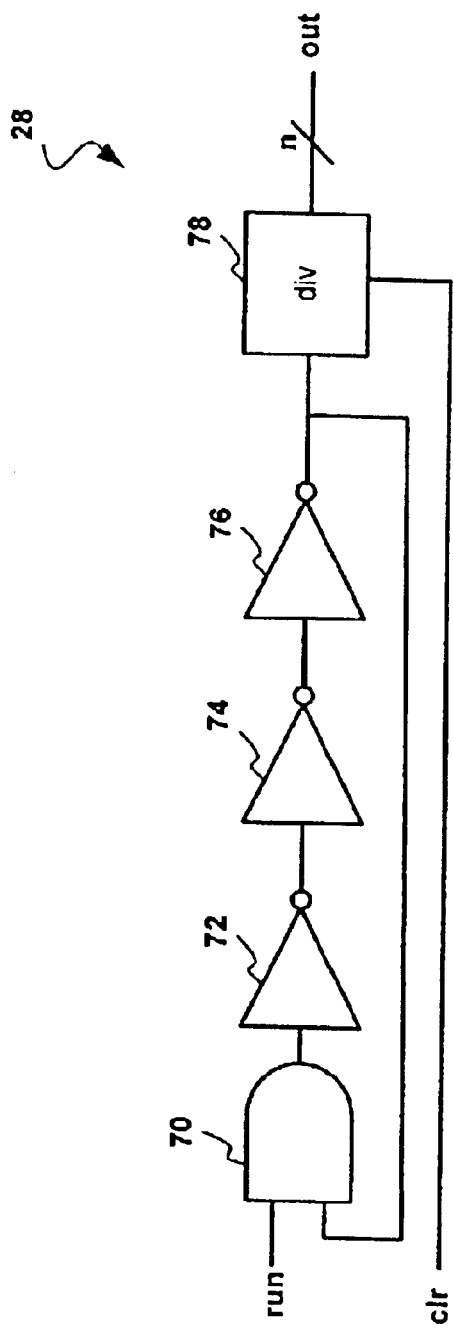
FIG. 5 illustrates a schematic drawing of a test circuit within the testing apparatus used to determine the effects of power supply noise on the integrated circuit shown in FIG. 1 according to an embodiment of the present invention.

A detailed schematic drawing of test circuit 28 (TC28) is shown in FIG. 5. In the current embodiment, TC28 is used to determine the effects that power supply noise has on the propagation delays of components within the core logic areas (e.g., 12, 14, 16, 18). Like the other test circuits, TC28 is comprised of series connected AND gate 70, inverters 72, 74, 76 and divider 78. In the current embodiment, the placement of elements and routing of traces of TC28 are the same as TC22. However, instead of using a dedicated, external power supply source, the elements of TC28 share a power supply source with the components of core logic area 12.

In the current embodiment, an inactive operating frequency and an active operating frequency for TC28 is measured with the components in the core logic areas 12, 14, 16, 18 and within the reserved area 20 inactive and active, respectively. The difference between the inactive operating frequency and the active operating frequency of TC28 represents the effects of power supply noise on the propagational delays of components within the core logic area 12. Propagational delay refers to the addition amount of time needed for signal to travel along a section of circuit due to resistance, impedance, switching delay, and component operational delay, among others.

Figure 6:
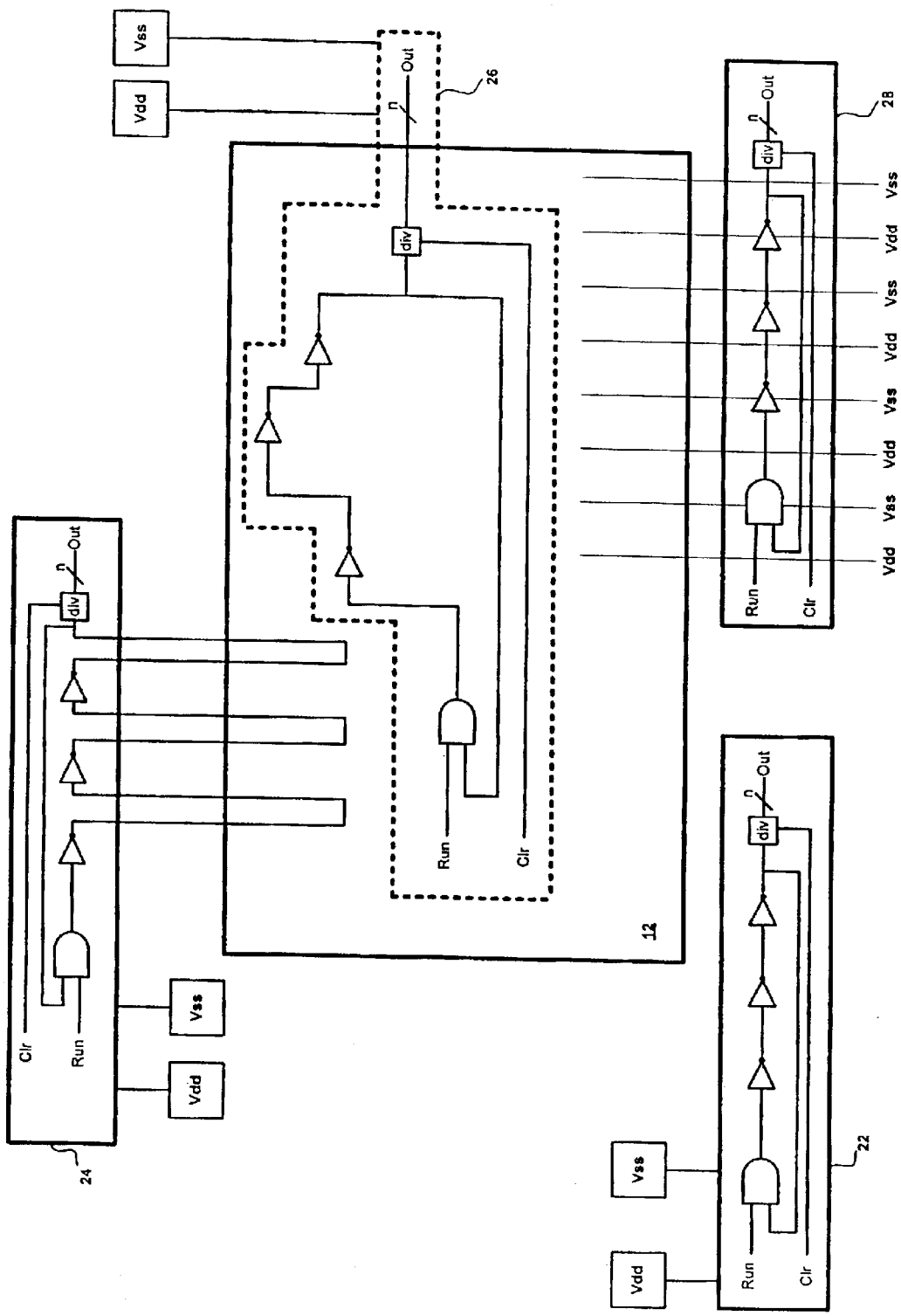
FIG. 6 is a detailed view illustrating the placement of the test circuits as shown in FIGS. 2–5 with respect to the integrated circuit shown in FIG. 1 according to an embodiment of the present invention.

FIG. 6 is a detailed view illustrating the placement of test circuits 22, 24, 26 and 28 (i.e., TC22, TC24, TC26, and TC28, respectively) in relation to a core logic area 12 of the IC chip 10 in accordance with to an embodiment of the present invention. It should be noted that alternative placement of the test circuits may be used while remaining within the scope of the present invention. Furthermore, multiple test circuits may be used to measure a specific portion of the IC chip 10. For example, multiple TC24's can be placed at various locations on the surface of the IC chip 10 to measure the delay variation across the IC chip 10 caused by manufacturing process variations. The delay variation indicates how much of the variation between test circuits was caused by noise effects and by other manufacturing variations.

As shown in FIG. 6, the test circuits TC22, TC24, and TC28 are located within the reserved area 20 of the IC chip 10, whereas TC26 is located within the core logic area 12. It is also apparent from FIG. 6 that the traces 50, 52, 54 connecting the elements of TC24 are routed deep into the core logic area 12 and that TC28 uses a power source which also supplies power to the components within the core logic area 12. It should be noted that the layout of the current embodiment as shown in FIG. 6 can be altered while remaining within the scope of the present invention. For example, TC26 may be restricted to a specific portion of the core logic area 12 to determine the effects of noise and cross-talk on a single component within the core logic area 12.

Figure 7A:
FIGS. 7A–7C illustrate the relationship of various signals within the test circuits illustrated in FIGS. 2–5 according to an embodiment of the present invention.
Figure 7B:
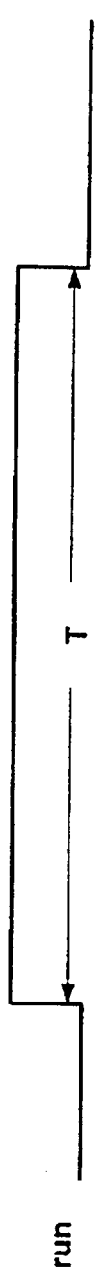
Figure 7C:

FIGS. 7A–7C illustrate the relationship of various signals within a test circuit of the current embodiment of the present invention. Referring to FIG. 2 (i.e., TC22) for example, the 'clr' and 'run' signals shown in FIGS. 7A and 7B, respectively, are supplied by an external device (such as a signal generator) to TC22. The 'clr' signal is applied to a 'clr' pin on the divider 38 and the 'run' signal is applied to an input of the AND gate 30. When the 'run' signal is applied, TC22 begins to oscillate. The number of oscillation cycles is observed by the divider 38 and is illustrated in FIG. 7C as the 'out' signal.

A typical timing sequence is as follows. First, the 'clr' signal is momentarily switched to the appropriate level to reset divider 38. Here, the 'clr' signal is momentarily switched to the low level, and then back to the high level to reset the divider 38. After the divider 38 is reset, the 'run' signal is applied to an input of the AND gate 30. The 'run' signal is applied for a time period, T. When the 'run' signal is applied, the ring oscillator is activated and the divider 38 begins to count the number of times inverter 36 changes state. A state change refers to the output of a test circuit (e.g., 22, 24, 26, 28) changing from one voltage threshold level to another voltage threshold level. For example in the present embodiment, when the output of inverter 36 changes from 0 volts to 3.3 volts a state change occurs. Likewise, when the output of inverter 36 changes from 3.3 volts to 0 volts, another state change occurs. Each state change is counted by divider 38. After the time period T expires, the 'run' signal is removed, the ring oscillator is deactivated, and the divider 38 count is frozen. As previously mentioned, the divider 38 count represents the number of oscillation cycles which occurred within time period T.

TC22's inactive operating frequency refers to the divider count obtained by output divider 38 when the desired components in the core logic areas 12, 14, 16, 18 and within the reserved area 20 are inactive. It should be noted that the divider 38 in the current embodiment is implemented using a counter, however, the use of other types dividers are within the scope of the present invention. Likewise, TC22's active operating frequency refers to the divider count obtained by divider 38 when the desired components in the core logic areas 12, 14, 16, 18 and within the reserved area 20 are active.

In the current embodiment, the timing operations of the test circuits during the determination of inactive and active operating frequencies are similar, the main difference being the condition of the IC chip 10. Looking at TC22, for example, measuring either the active or inactive frequency measurements includes first resetting the divider 38 with the 'clr' signal. Next, the 'run' signal is applied to the AND gate 30 to activate the ring oscillator. When activated, the ring oscillator outputs a set of pulses which are counted by the divider 38. After the predetermined time period T has expired, the 'run' signal is removed, thereby deactivating the ring oscillator and freezing the count on the divider 38. The operating frequency is determined from the total count obtained by the divider 38 during the predetermined time period that the ring oscillator was activated. For active frequency measurements, the IC chip 10 is activated before the operating frequency is determined, whereas for inactive frequency measurements, the IC chip 10 is deactivated before the operating frequency is determined.

It should be noted that the 'clr', 'run', and 'out' traces, in the current embodiment, terminate at contact pads located within the reserved area 20 of the IC chip 10. These contact pads are then connected to an external testing device which transmits/receives the appropriate signals to/from the test circuits. Alternative configurations can be implemented while remaining within the scope of the present invention. For example, a separate divider can be located within the external testing device instead of within each test circuit.

In the current embodiment, the value initially chosen for T is not critical, however, the ability to accurately reproduce the chosen T is desirable. In other words, the run signal applied to TC22 should be of the same duration as the run signal applied to TC24 to obtain comparable results. Alternatively, a different time period can be applied to one or more of the test circuits and further calculations completed to obtain comparable results. For example, the run signal applied to TC22 may be twice the duration as the run signal applied to TC24. Thus, by multiplying the count of TC24 by two, comparable results are obtainable.

Figure 8:
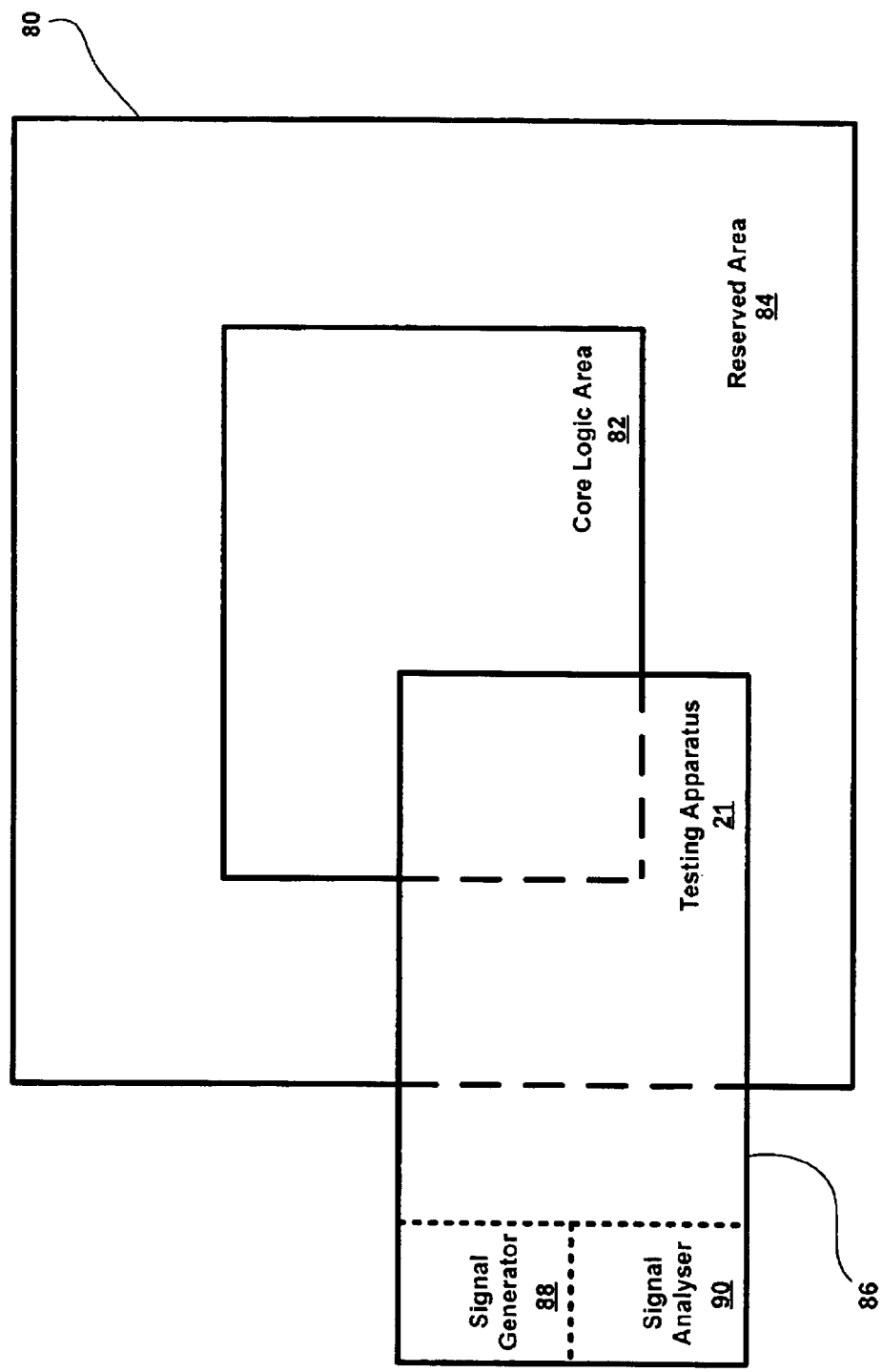
FIG. 8 illustrates apparatus for testing an integrated circuit in accordance with an embodiment of the present invention.

FIG. 8 illustrates testing system 86 for testing a integrated circuit in accordance with an embodiment of the present invention. In the current embodiment, the integrated circuit being tested is a solid state memory device 80. It should be noted, however, that the testing system 86 can be used for other types of integrated circuits. The memory device 80 is comprised of a core logic area 82 and a reserved area 84. The core logic area 82 is comprised of a multitude of components (such as memory arrays, transistors, capacitors, resistors, traces, dividers, decoders, switches, and multiplexers, among others). The reserved area 84 contains a multitude of peripheral circuits (such as power supply circuits, testing circuits, and amplifier circuits among others.

The testing system 86 is comprised of a testing apparatus 21, a signal generator 88, and a signal analyzer 90, among others. In the current embodiment, the testing apparatus 21 is comprised of a plurality of ring oscillators. The ring oscillators are constructed such that they can dynamically measure the effects of noise and cross-talk on the memory device 80, as discussed in conjunction with FIGS. 1–7.

As shown in FIG. 8 and as discussed in conjunction with FIG. 6, the testing apparatus 21 is carried by the integrated circuit being tested. As shown in FIG. 8, a portion of the testing apparatus 21 is located within the core logic area 82 and a portion within the reserved area 84 of memory device 80. In an alternative embodiment, a portion of testing apparatus 21 may be located external to the integrated circuit being tested.

In the current embodiment, the testing apparatus 21 includes four ring oscillators. The elements and traces of the first ring oscillator are located within the reserved area 84 of the memory device 80 and mimic a data path within the core logic area 82. The elements of the second ring oscillator are also located within the reserved area 84, however, the traces connecting the elements are routed within the core logic area 82. The elements and traces of the third ring oscillator are randomly placed within the core logic area 82. Power is supplied to the first, second, and third ring oscillators by external power supplies. Finally, the elements and traces of the fourth ring oscillator are located within the reserved area 84 and mimic a data path within said memory device 80. Unlike the first three ring oscillators, the fourth ring oscillator shares a power source with at least one of the multitude of components within the core logic area 82.

As previously mentioned the testing system 86 includes a signal generator 88. The signal generator 88 in the current embodiment produces a 'clr' signal and a 'run' signal, among others. The 'clr' and 'run' signals are provided to each of the ring oscillators as discussed in conjunction with FIG. 7. The testing system 86 also includes a signal analyzer 90. The signal analyzer 90 of the current embodiment retrieves the output signals (also discussed in conjunction with FIG. 7) from the ring oscillators.

The testing system 86, in the current embodiment, may use the ring oscillator output signals to determine an operating reference signal, the substrate coupling effect, and cross-talk effects for the memory device 80. Furthermore, the testing system 86 may use the output signals to determine the accuracy of an interconnect capacitance extraction value, the effect of system noise on the operational speed, the maximum degradation expected for a logic path, and an effect of power supply noise on a signal propagation delay for the memory device 80.

Figure 9:
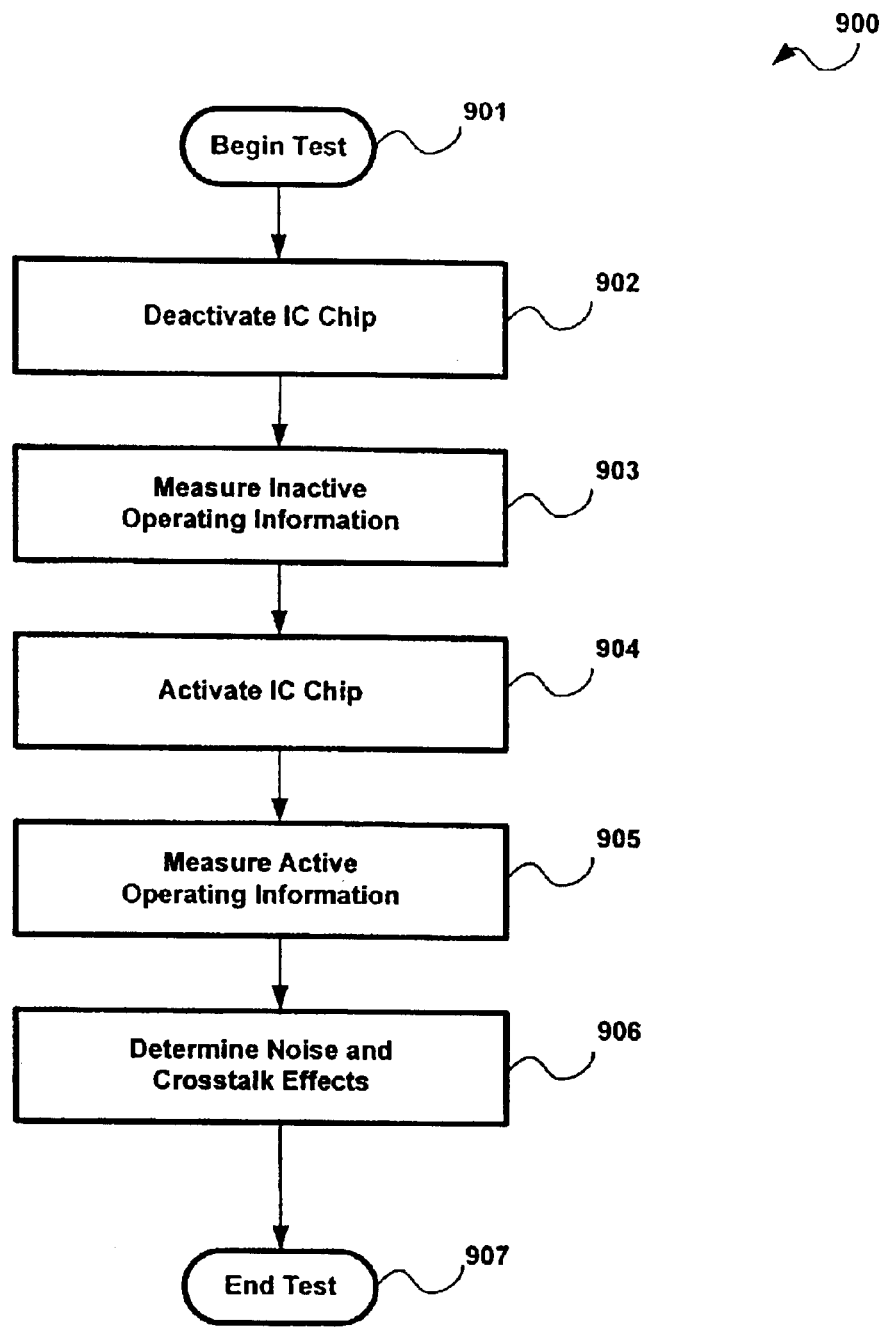
FIG. 9 illustrates an operational process for testing the integrated circuit shown in FIG. 8 in accordance with an embodiment of the present invention.

FIG. 9 illustrates an operational process 900 for testing an IC chip in accordance with an embodiment of the present invention. In one embodiment, operational process 900 is implemented as one of a series of tests completed by a manufacturer during device fabrication. In an alternative embodiment, operational process 900 can be implemented as a sole test on a newly designed IC chip to determine design shortcomings before full-scale manufacturing is implemented. Other embodiments may also be used while remaining within the scope of the present invention. For example, operational process 900 can be automatically initiated after the IC chip is packaged and ready for shipment, or in another embodiment, manually initiated during design phase testing of an IC chip.

Furthermore, operational process 900 can be applied to each IC chip produced, or to a predetermined sampling of IC chips (e.g., on two-out-of-ten IC chips manufactured). In yet another embodiment, the operating conditions of the IC chip can be measured after the IC chip has been placed within its final operating environment (i.e., a computer system, switch, etc.). A determination can then be made as to whether the operating environment is conducive to the proper functionality of the IC Chip. Periodically measurements of the IC chip's delay falls are compared to the expected delay range, and thus, the system temperature and power supply quality and susceptibility from externally radiated noise sources is determined.

Operational process 900 is initiated by operation 901. In the current embodiment, operation 901 is automatically initiated during the IC chip fabrication stage, before a IC chip is packaged and shipped to a customer. Alternative methods of initiating operational process 900 can be implemented while remaining within the scope of the present invention.

After operation 901 initiates operational process 900, operation 902 deactivates the IC chip being tested. In the current embodiment, operation 902 deactivates the entire IC chip, including all the test circuits that were previously activated. For example, the IC chip, or a portion of the IC chip, may have been activated by another test within a series of applied tests. Alternatively, operation 902 may deactivate only a portion of the IC chip, such as a specific core logic area and a specific test circuit, while remaining within the scope of the present invention.

Figure 10:
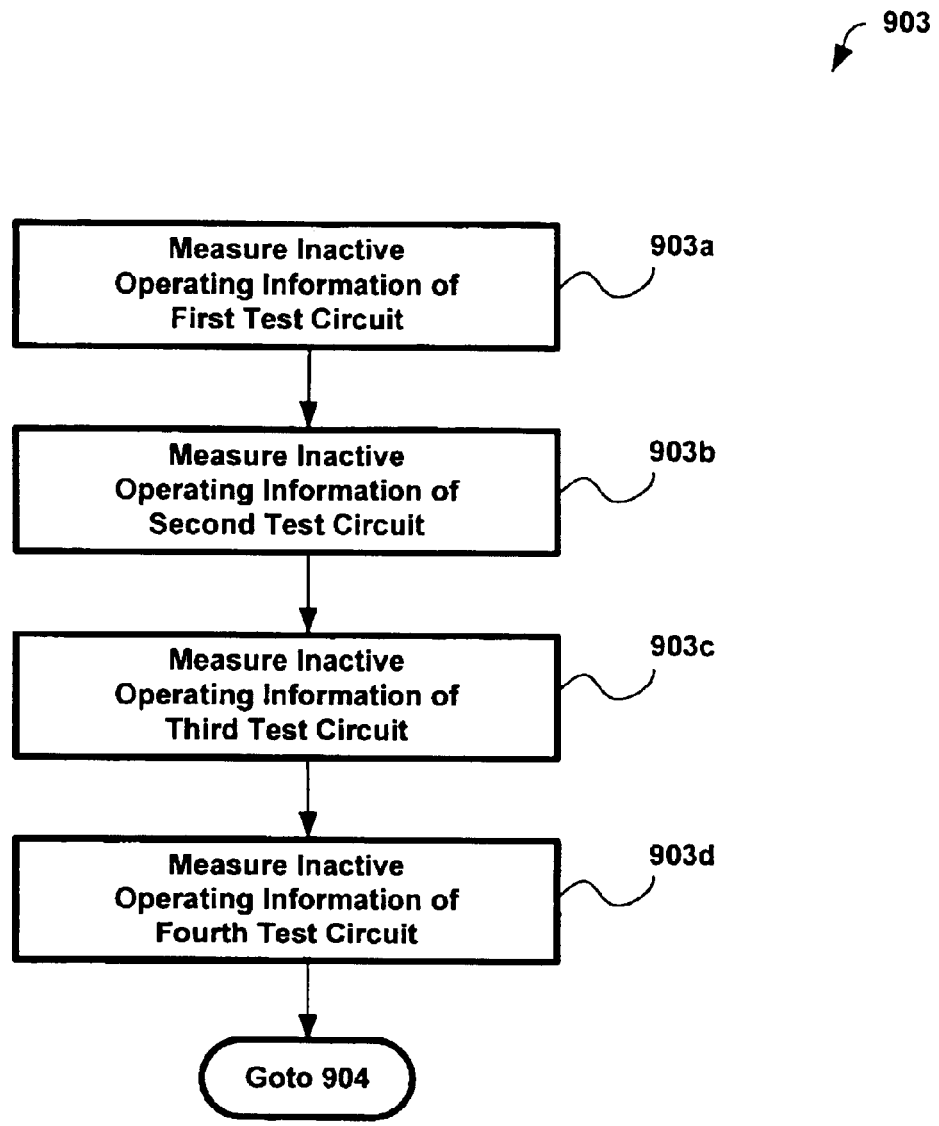
FIG. 10 is a detailed view of operation 903 of the operational process illustrated in FIG. 9 according to one embodiment.

After the IC chip is deactivated, operation 903 begins to gather the test circuits' inactive information. In the current embodiment, operation 903 gathers the inactive information by sequentially activating and deactivating the four test circuits TC22, TC24, TC26, TC28 discussed above in conjunction with FIGS. 2–5. For example, as illustrated in FIG. 10, operation 903 activates TC22 (e.g. the first test circuit) and determines its inactive operating frequency (i.e., the operating reference signal). TC22 is then deactivated and TC24 (e.g., the second test circuit) is activated. The inactive operating frequency of TC24 is determined and TC24 is deactivated. Operation 903 then continues to activate and deactivate the remaining test circuits (here, TC26 [e.g., the third test circuit] and TC28 [e.g., the fourth test circuit]). Each test circuit is activated for the predetermined time period, T, as discussed above.

It should be noted that the sequential order in which the test circuits are activated can be varied while remaining within the scope of the present invention. In an alternative embodiment, multiple test circuits may be simultaneously activated. The information gathered from each test circuit by operation 903 can be stored in buffers located on-chip and in external memory devices, among others.

Operation 904 then activates the IC chip that is undergoing testing. In the current embodiment, operation 904 activates the entire IC chip, including the core logic areas and any peripheral circuitry located with the reserved area, so that the IC chip is functioning at its normal operating level. Activating the IC chip to its normal operating level allows measurement of the noise and cross-talk effects that the IC chip will be subjected to when integrated into its intended system. Alternatively, operation 904 may activate only a portion of the IC chip, such as a specific core logic area, for localized testing while remaining within the scope of the present invention.

After the IC chip is activated, operation 905 begins to gather the test circuits' active information from the test circuits. In the current embodiment, operation 905 gathers the test circuits' active information by sequentially activating and deactivating the four test circuits TC22, TC24, TC26, TC28 as discussed above in conjunction with operation 903. The information gathered from each test circuit by operation 905 can also be stored in on-chip buffers and within external memory devices, among others.

Operation 906 determines the effects that noise and cross-talk have on the IC chip. For example, the active information of each test circuit is compared to the inactive information for the same test circuit to ascertain certain effects of noise and cross-talk. Likewise, the active (and inactive) information of each test circuit can be compared to the inactive information of the test circuit TC22 (i.e., the operating reference signal) to determine other effects caused by noise and cross-talk. Examples of the specific quantities that are measurable have been discussed in more detail in conjunction with FIGS. 2–5. Alternatively, additional quantities can also be determined. For example, the effects of system temperature on the IC chip can be determined. In such an alternative, the above-mentioned tests are repeated after the IC chip's die substrate is heated due to a long run time. The operating frequency of the 'hot' chip is compared to the previous measurements. Because operating frequency is inversely proportional to temperature, a determination can easily be made as to whether the IC chip requires a heat sink or cooling fan, among others.

Operation 907 then terminates operational process 900. It should be noted that the quantities determined by operational process 900 can be used by a test operator or manufacturer to reject a chip containing a failure, to determine the probability of future chip failures, or to create alternative chip designs that eliminate potential failure points, among others.

The above-described embodiments of the invention are intended to be illustrative only. Numerous alternative embodiments may be devised by those skilled in the art without departing from the scope of the following claims. For example, a portion of the IC chip may remain active, or remain inactive, while determine the inactive operating information, or active operating information, respectively. As a further example, the test apparatus may contain additional test circuits capable of measuring additional quantities. As a further example, test circuits other than, or in conjunction with ring oscillators may be used.

What is claimed is:

1. A method for measure the effects of on-chip noise on signal propagation within an integrated circuit, said integrated circuit having a core logic area with a plurality of components therein, the method comprising:

measuring an inactive operating frequency of a first test circuit, said first test circuit having a first plurality of elements connected by a first plurality of traces, said first test circuit being constructed to mimic a data path within said core logic area, said inactive operating frequency representing an operating reference signal;

measuring an inactive operating frequency of a second test circuit, said second test circuit having a second plurality of elements connected by a second plurality of traces, said second plurality of traces being routed within said core logic area;

measuring an inactive operating frequency of a third test circuit, said third test circuit having a third plurality of elements connected by a third plurality of traces, said third plurality of elements being randomly located within said core logic area; and measuring an inactive operating frequency of a fourth test circuit, said fourth test circuit having a fourth plurality of elements connected by a fourth plurality of traces, said fourth test circuit being constructed to mimic a data path within said core logic area, said fourth test circuit sharing a power source with at least one of said plurality of components within said core logic area, wherein said inactive operating frequencies of said first, second, third, and fourth test circuits represent one or more effects of on-chip noise on signal propagation.

2. The method of claim further comprising:

determining the accuracy of an interconnect capacitance extraction value by comparing said inactive operating frequency of said second test circuit to said operating reference signal.

3. The method of claim further comprising:

determining a maximum degradation for a logic path within said integrated circuit by comparing the inactive operating frequency of said third test circuit to said operating reference signal.

4. The method of claim 1 further comprising:
determining an effect of power supply noise on a propagation delay within said integrated circuit by comparing the inactive operating frequency of said fourth test circuit to said operating reference signal.

5. The method of claim further comprising:
measuring an active operating frequency of said first test circuit;
measuring an active operating frequency of said second test circuit;
measuring an active operating frequency of said third test circuit; and
measuring an active operating frequency of said fourth test circuit.

6. The method of claim 5 further comprising:
determining an effect of substrate-noise-coupling on said integrated circuit by comparing the active operating frequency of said first test circuit to said operating reference signal.

7. The method of claim 5 further comprising:
determining an effect of cross-talk on a delay within said integrated circuit by comparing the active operating frequency of said second test circuit to the inactive operating frequency of said second test circuit.

8. The method of claim 5 further comprising:
determining an effect of system noise on an operational speed of said integrated circuit by comparing the active operating frequency of said third test circuit to the inactive operating frequency of said third test circuit.

9. The method of claim 5 wherein said first test circuit includes a first ring oscillator, said first ring oscillator having at least one of a logic gate and an inverter, wherein the step of measuring an inactive operating frequency of said first test circuit and the step of measuring an active operating frequency of said first test circuit further comprise:
resetting a divider,
activating said first ring oscillator, an output of said activated first ring oscillator changing states;
counting the number of times said activated first ring oscillator changes states with said divider; and
deactivating said first ring oscillator after a first predetermined time period has expired.

10. The method of claim 9 wherein said first predetermined time period is equal to at least one of a second predetermined time period related to said second test circuit, a third predetermined time period related to said third test circuit, and a fourth predetermined time period related to said fourth test circuit.

11. The method of claim 5 wherein said second test circuit includes a second ring oscillator, said second ring oscillator having at least one of a logic gate and an inverter, wherein the step of measuring an inactive operating frequency of a second test circuit and the step of measuring an active operating frequency of said second test circuit further comprise:
resetting a divider,
activating said second ring oscillator, an output of said activated second ring oscillator changing states;
counting the number of times said activated second ring oscillator changes states with said divider; and
deactivating the second ring oscillator after a second predetermined time period has expired.

12. The method of claim 11 wherein said second predetermined time period is equal to at least one of a first predetermined time period related to said first test circuit, a third predetermined time period related to said third test circuit, and a fourth predetermined time period related to said fourth test circuit.

13. The method of claim 5 wherein said third test circuit includes a third ring oscillator, said third ring oscillator having at least one of a logic gate and an inverter, wherein the step of measuring an inactive operating frequency of a third test circuit and the step of measuring an active operating frequency of said third test circuit further comprise:
resetting a divider;
activating said third ring oscillator, an output of said activated third ring oscillator changing states;
counting the number of times said activated third ring oscillator changes states with said divider, and
deactivating the third ring oscillator after a third predetermined time period has expired.

14. The method of claim 13 wherein said third predetermined time period is equal to at least one of a first predetermined time period related to said first test circuit, a second predetermined time period related to said second test circuit, and a fourth predetermined time period related to said fourth test circuit.

15. The method of claim 5 wherein said fourth test circuit includes a fourth ring oscillator, said fourth ring oscillator having at least one of a logic gate, an inverter and a divider, wherein the step of measuring an inactive operating frequency of a fourth test circuit and the step of measuring an active operating frequency of said fourth test circuit further comprise:
resetting a divider;
activating said fourth ring oscillator, an output of said activated fourth ring oscillator changing states;
counting the number of times said activated fourth ring oscillator changes states with said divider; and
deactivating the fourth ring oscillator after a fourth predetermined time period has expired.

16. The method of claim 15 wherein said fourth predetermined time period is equal to at least one of a first predetermined time period related to said first test circuit, a second predetermined time period related to said second test circuit, and a third predetermined time period related to said third test circuit.

* * * * *

UNITED STATES PATENT AND TRADEMARK OFFICE
CERTIFICATE OF CORRECTION

PATENT NO.    : 6,807,502 B2
DATED         : October 19, 2004
INVENTOR(S)   : William E. Corr It is certified that error appears in the above-identified patent and that said Letters Patent is hereby corrected as shown below:

<u>Title page,</u>
Item [57], ABSTRACT,
Lines 2 and 15, delete "on-chin" and insert therefore -- on-chip --.
Line 13, after "first" insert -- , --.

<u>Column 1,</u>
Line 20, delete "circuit" and insert therefore -- circuits --.
Line 45, delete "manufactures" and insert therefore -- manufacturers --.

<u>Column 6,</u>
Line 15, delete "cross talk" and insert therefore -- cross-talk --.
Line 64, after "frequency" delete "of".

<u>Column 7,</u>
Line 32, delete "cross talk" and insert therefore -- cross-talk --.
Line 56, delete "addition" and insert therefore -- additional --.
Line 63, after "with" delete "to".

<u>Column 8,</u>
Line 59, after "types" insert -- of --.

<u>Column 9,</u>
Line 37, delete "a" and insert therefore -- an --.
Line 50, after "others." insert -- ) --.

<u>Column 10,</u>
Line 56, delete "Chip" and insert therefore -- chip --.
Line 63, delete "a" and insert therefore -- an --.

<u>Column 11,</u>
Line 37, delete "with" and insert therefore -- within --.

<u>Column 12,</u>
Line 28, delete "measure" and insert therefore -- measuring --.
Lines 58 and 63, after "claim" insert therefore -- 1 --.

UNITED STATES PATENT AND TRADEMARK OFFICE
CERTIFICATE OF CORRECTION

PATENT NO. : 6,807,502 B2
DATED : October 19, 2004
INVENTOR(S) : William E. Corr It is certified that error appears in the above-identified patent and that said Letters Patent is hereby corrected as shown below:

Column 13,
Line 6, after "claim" insert therefore -- 1 --.

Signed and Sealed this

First Day of March, 2005

JON W. DUDAS
*Director of the United States Patent and Trademark Office*